United States Patent
Diana et al.

(10) Patent No.: US 10,693,048 B2
(45) Date of Patent: Jun. 23, 2020

(54) FLIP-CHIP SMT LEDS WITH VARIABLE NUMBER OF EMITTING SURFACES

(71) Applicant: Lumileds LLC, San Jose, CA (US)

(72) Inventors: Frederic S. Diana, Santa Clara, CA (US); Emo Fancsali, Heusden-Zolder (BE); Thierry De Smet, Sunnyvale, CA (US); Gregory Guth, San Jose, CA (US); Yourii Martynov, Geldrop (NL); Oleg B. Shchekin, San Francisco, CA (US); Jyoti Bhardwaj, Cupertino, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/765,678

(22) PCT Filed: Sep. 2, 2016

(86) PCT No.: PCT/US2016/050071
§ 371 (c)(1),
(2) Date: Apr. 3, 2018

(87) PCT Pub. No.: WO2017/062119
PCT Pub. Date: Apr. 13, 2017

(65) Prior Publication Data
US 2019/0088840 A1   Mar. 21, 2019

Related U.S. Application Data

(60) Provisional application No. 62/238,666, filed on Oct. 7, 2015.

(51) Int. Cl.
*H01L 33/60* (2010.01)
*H01L 33/48* (2010.01)
(Continued)

(52) U.S. Cl.
CPC ............ *H01L 33/60* (2013.01); *H01L 33/486* (2013.01); *H01L 33/50* (2013.01); *H01L 33/52* (2013.01);
(Continued)

(58) Field of Classification Search
CPC ......... H01L 33/52; H01L 33/54; H01L 33/56; H01L 33/58; H01L 33/60; H01L 33/483; H01L 33/486; H01L 33/505
See application file for complete search history.

(56) References Cited

U.S. PATENT DOCUMENTS 9,397,270 B2 *  7/2016  Sanga ................. H01L 33/38
2010/0029023 A1  2/2010  Neff et al.
(Continued)

FOREIGN PATENT DOCUMENTS

| CN | 1189951 C | 2/2005 |
|---|---|---|
| CN | 1885580 A | 12/2006 |

(Continued)

OTHER PUBLICATIONS

"International Application Serial No. PCT US2016 050071, International Search Report dated Dec. 9, 2016", 5 pgs.
(Continued)

*Primary Examiner* — Sue A Purvis
*Assistant Examiner* — Scott Stowe
(74) *Attorney, Agent, or Firm* — Schwegman Lundberg & Woessner, P.A.

(57) ABSTRACT

A method to make light-emitting diode (LED) units include arranging LEDs in a pattern, forming an optically transparent spacer layer over the LEDs, forming an optically reflective layer over the LEDs, and singulating the LEDs into LED units. The method may further include, after forming the optically transparent spacer layer and before singulating the LEDs, forming a secondary light-emitting layer that
(Continued)

conforms to the LEDs, cutting the LEDs to form LED groups having a same arrangement, spacing the LED groups on a support, and forming the optically reflective layer in spaces between the LED groups.

19 Claims, 14 Drawing Sheets

(51) Int. Cl.
*H01L 33/50* (2010.01)
*H01L 33/52* (2010.01)
*H01L 33/58* (2010.01)

(52) U.S. Cl.
CPC ...... *H01L 33/58* (2013.01); *H01L 2933/0058* (2013.01)

(56) References Cited

U.S. PATENT DOCUMENTS

| | | |
|---|---|---|
| 2011/0069256 A1 | 3/2011 | Ohkubo |
| 2011/0291145 A1 | 12/2011 | Han et al. |
| 2013/0285097 A1* | 10/2013 | Chen ................. H01L 33/60 257/98 |

FOREIGN PATENT DOCUMENTS

| | | |
|---|---|---|
| CN | 101771112 A | 7/2010 |
| CN | 102439739 A | 5/2012 |
| CN | 102931318 A | 2/2013 |
| CN | 103378279 A | 10/2013 |
| CN | 104733597 A | 6/2015 |
| CN | 108431972 | 8/2018 |
| EP | 1204151 | 5/2002 |
| EP | 2854186 | 4/2015 |
| JP | 2013-115088 | 6/2013 |
| JP | 2018531513 | 10/2018 |
| KR | 101480106 B1 | 1/2015 |
| KR | 20180063278 | 6/2018 |
| TW | 201724584 | 7/2017 |
| WO | 2015/011590 | 1/2015 |
| WO | 2017062119 | 4/2017 |

OTHER PUBLICATIONS

"International Application Serial No. PCT US2016 050071, Written Opinion dated Dec. 9, 2016", 6 pgs.

"International Application Serial No. PCT US2016 050071, International Preliminary Report on Patentability dated Apr. 19, 2018", 8 pgs.

"Chinese Application Serial No. 2016800717948, Office Action dated Mar. 30, 2020", (w/English Translation), 21 pgs.

* cited by examiner

FLIP-CHIP SMT LEDS WITH VARIABLE NUMBER OF EMITTING SURFACES

CROSS-REFERENCE TO RELATED APPLICATIONS

The present application claims priority to U.S. Provisional Patent Application No. 62/238,666, filed Oct. 7, 2015. U.S. Provisional Patent Application No. 62/238,666 is incorporated herein.

FIELD OF THE INVENTION

The present disclosure relates to semiconductor light-emitting diodes (LEDs), and more particular to side-emitting surface-mount technology (SMT) LEDs.

BACKGROUND

In illumination and display applications, it is desirable to uniformly illuminate a diffuser screen using the minimal number of LEDs. In these applications, side emission with reduced or suppressed top emission is preferred. However many LEDs are Lambertian emitters that emit light in an omnidirectional pattern. Thus what is needed is an LED packaging technique that transforms Lambertian emitters into LEDs with variable number of emitting surfaces (hereafter "N-sided emitters") with enhanced lateral radiation pattern into specific azimuthal directions.

SUMMARY

In one or more examples of the present disclosure, a method to make light-emitting diode (LED) units includes arranging LEDs in a pattern, forming an optically transparent spacer layer over the LEDs, forming an optically reflective layer over the LEDs, and singulating the LEDs into LED units. The method may further include, after forming the optically transparent spacer layer and before singulating the LEDs, forming a secondary light-emitting layer that conforms to the LEDs, cutting the LEDs to form LED groups having a same arrangement, spacing the LED groups on a support, and forming the optically reflective layer in spaces between the LED groups.

BRIEF DESCRIPTION OF THE DRAWINGS

In the drawings.

Use of the same reference numbers in different figures indicates similar or identical elements.

DETAILED DESCRIPTION

Figure 1:
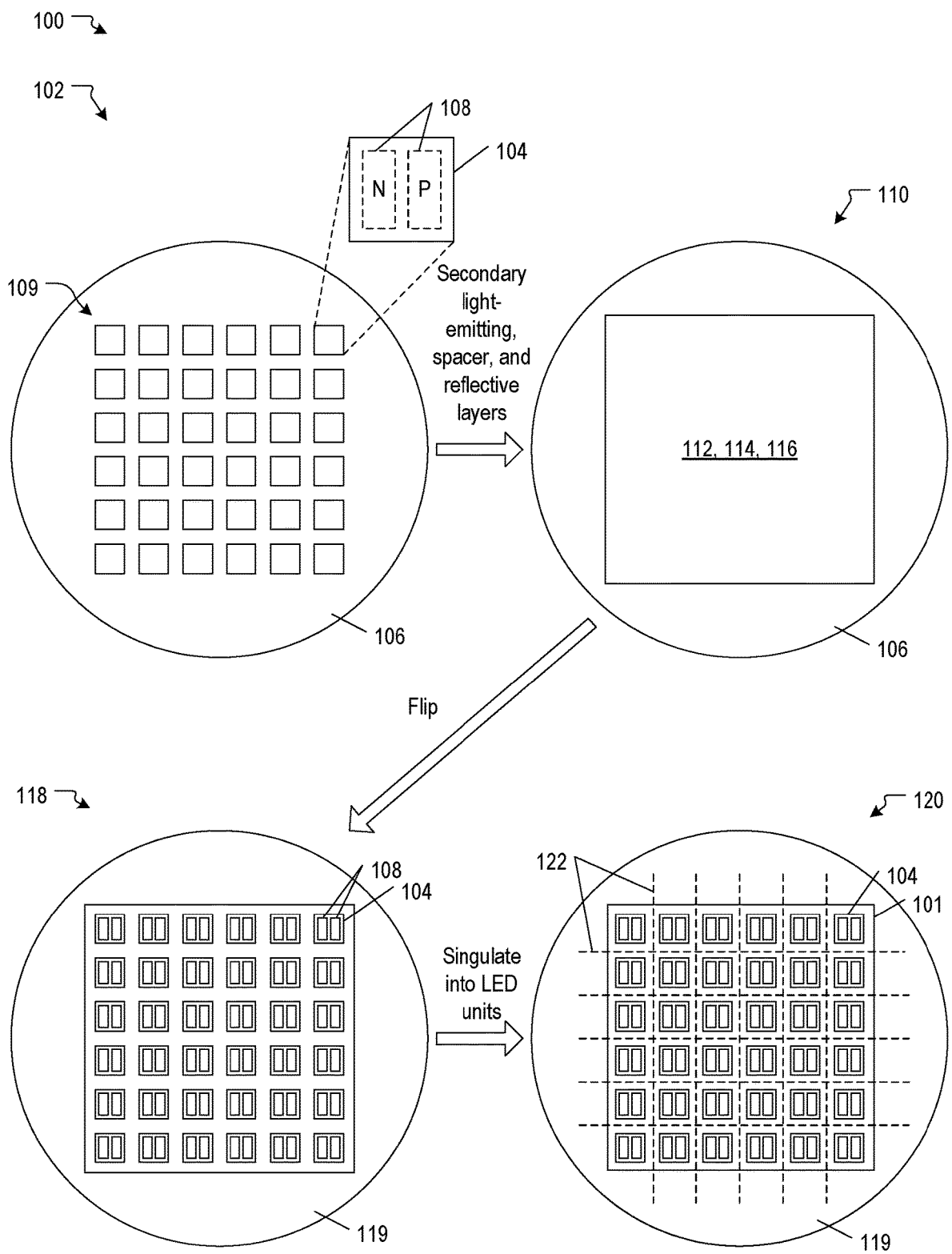
FIG. 1 illustrates a top view of a packaging process for making four-sided emitter packages in examples of the present disclosure.

FIG. 1 illustrates a top view of a level-1 packaging process 100 for making light-emitting diode (LED) units or packages 101 (only one is labeled in view 120) in examples of the present disclosure. LED units 101 may be four-sided emitters that emit from four lateral surfaces. As shown in a view 102, LEDs 104 (only one is labeled) are placed on a support 106. LEDs 104 are surface-mount devices that can be mounted or placed directly onto the surface of interposers or printed circuit boards (PCBs). Each LED 104 has a bottom contact surface and top and side-emitting surfaces. The bottom contact surface includes anode and cathode contacts 108 (shown in phantom). LED 104 may have an area of 0.1 millimeter (mm) by 0.1 mm to 10 by 10 mm2 and have a thickness from 10 microns (μm) to 1 mm. LEDs 104 may be a flip-chip chip-scale package (CSP) LEDs. A pick-and-place machine picks up LEDs 104 from a tray or a reel and places them with their bottom contact surfaces facing down on support 106. LEDs 104 are arranged in a pattern on support 106, such as in a square or rectangular matrix 109 where neighboring LEDs 104 are spaced equally apart. Support 106 may be a tacky tape on a metal frame.

As shown in view 110, one or more layers 112, 114, and 116 are formed over LEDs 104 on support 106. Note that the use of the term "over" includes one element being directly atop another element.

In some examples of the present disclosure, a secondary light-emitting layer 112 is formed over LEDs 104 on support 106. Secondary light-emitting layer 112, also referred to as a wavelength converting layer, converts part of the primary light emitted by LEDs 104 to a secondary light of a different wavelength. The secondary light combines with the remainder of the primary light to produce a desired color. Secondary light-emitting layer 112 may be a laminate including a layer of titanium oxide (TiOx) (or another translucent or diffusive metal oxide) in silicone followed by a layer of phosphor in silicone. The layer of TiOx in silicone has a thickness of 10300 μm, and the phosphor in silicone layer has a thickness of 10-300 μm. A laminating machine may laminate secondary light-emitting layer 112 over and in-between LEDs 104 on support 106. As secondary light-emitting layer 112 is relatively thin, it conforms to the topography of LEDs 104 on support 106. In some examples secondary light-emitting layer 112 is omitted when only the primary light is desired.

An optically transparent spacer layer 114 is formed over secondary light-emitting layer 112. In other examples that are without secondary light-emitting light 112, transparent spacer layer 114 is formed over LEDs 104 on support 106. Transparent spacer layer 114 encapsulates LEDs 104 and provides the proper spacing between LEDs 104 and a subsequent layer. Transparent spacer layer 114 may be silicone or glass. Transparent spacer layer 114 may have a thickness of 0 to 10 mm (e.g., 675 μm). A molding machine molds transparent spacer layer 114 over secondary light-emitting layer 112 or LEDs 104 and support 106. Transparent spacer layer 114 has a completely planar top surface or a planar top surface with indentations, such as inverted cones or dimples, over LEDs 104.

An optically reflective layer 116 is formed over transparent spacer layer 110. Reflective layer 116 prevents light from exiting through the top of LED units 101. Reflective layer 116 may be TiOx (or another translucent or diffusive metal oxide) in silicone. Reflective layer 116 may have a thickness of 10 to 300 μm. A molding machine may mold a reflective layer 116 over transparent spacer layer 110. Reflective layer 116 may be molded with a planar top surface. When transparent spacer layer 114 has inverted cones or dimples on its top surface, reflective layer 116 would fill in those indentations. At this point LEDs 104 are held together by one or more layers 112, 114, and 116.

As shown in view 118, LEDs 104 (only one is labeled) are flipped over by transferring them to a new support 119 so contacts 108 (only two are labeled) on their bottom contact surfaces are visible. As shown in view 120, the LEDs 104 (only one is labeled) are singulated along orthogonal scribe lanes 122 (only two are labeled) to form individual LED units 101 (only one is labeled).

Figure 2:
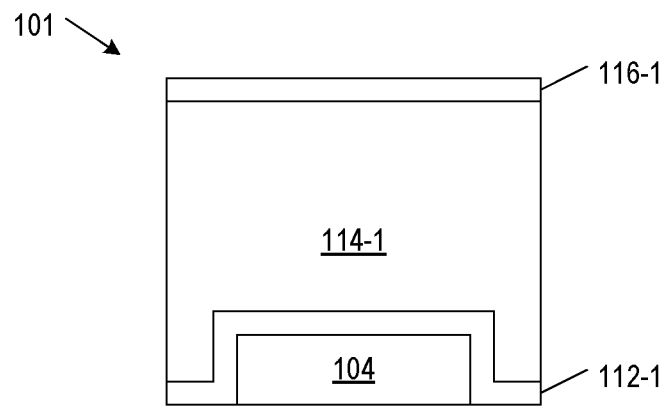
FIGS. 2 and 3 respectively illustrate a side cross-sectional view and a top view of a four-sided emitter package of FIG. 1 in examples of the present disclosure.
Figure 3:
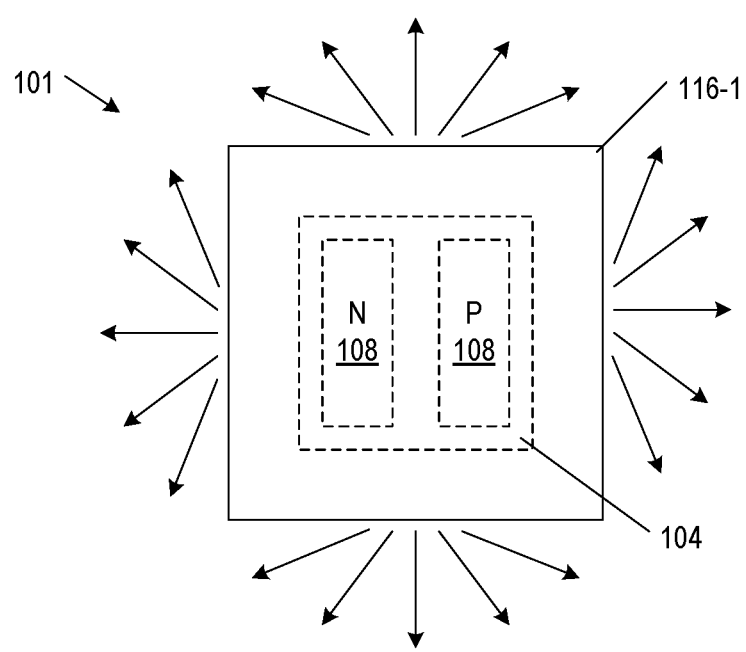

FIGS. 2 and 3 respectively illustrate a side cross-sectional view and a top view of LED unit 101 in examples of the present disclosure. LED unit 101 includes LED 104, a secondary light emitter 112-1 over top and side-emitting surfaces of the LED, a transparent spacer 114-1 over the secondary light emitter, and a reflector 116-1 over a top surface of the transparent spacer. LED 104 typically has the shape of a rectangular prism but may be another shape such as a cube or a cylinder. Secondary light emitter 112-1 has the shape of a top hat with a crown that receives LED 104 and a brim that surrounds the base of the LED. Transparent spacer 114-1 has the shape of a cap with an opening that receives the crown of secondary light emitter 112-1 and a rim that sits on the brim of the secondary light emitter. Reflector 116-1 has the shape of a plate that sits over the top of transparent spacer 114-1. As shown in FIG. 3, LED unit 101 only emits light from its four lateral surfaces that are not covered by reflector 116-1.

Figure 4:
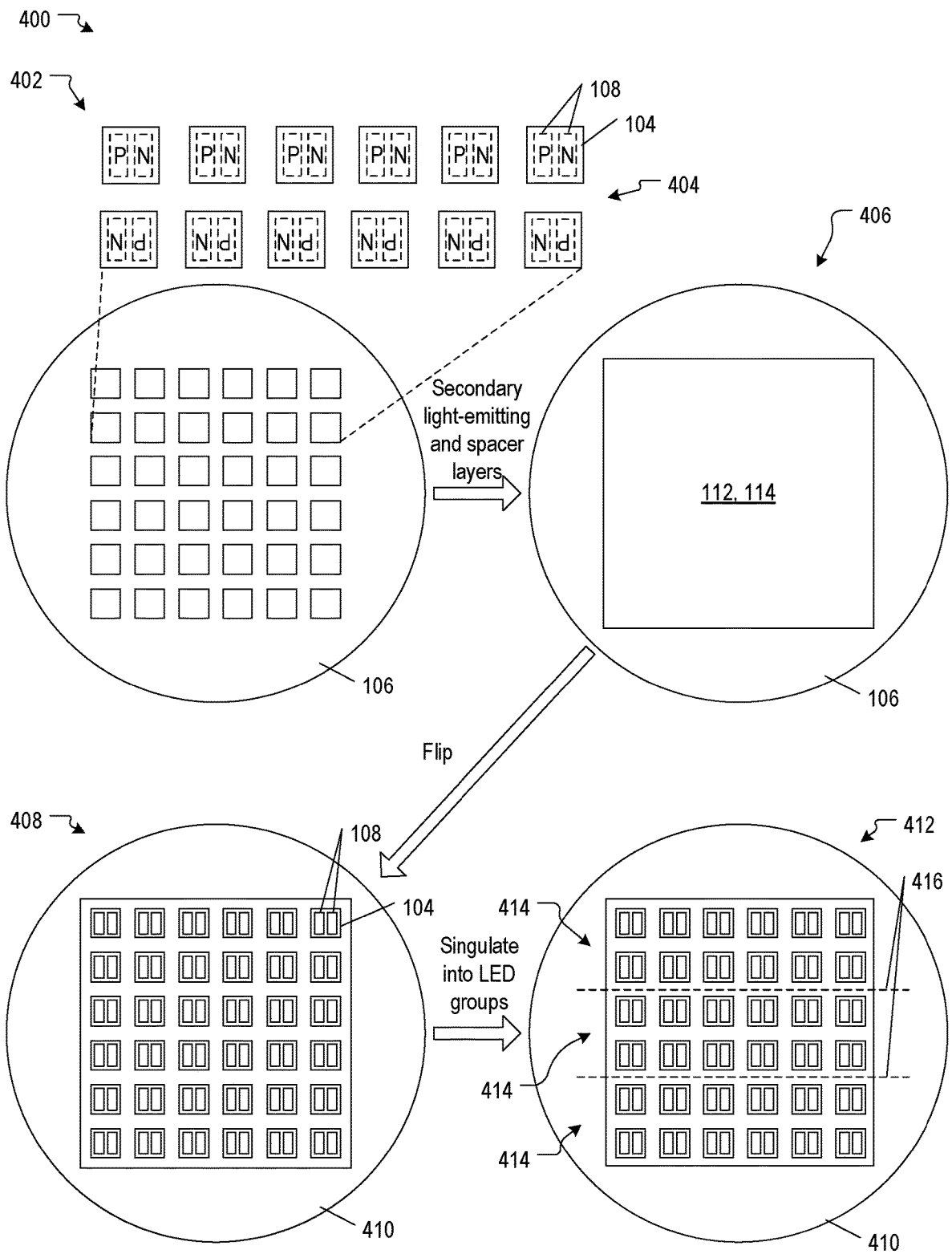
FIGS. 4 and 5 illustrate a top view of a packaging process for making three-sided emitter packages in examples of the present disclosure.
Figure 5:
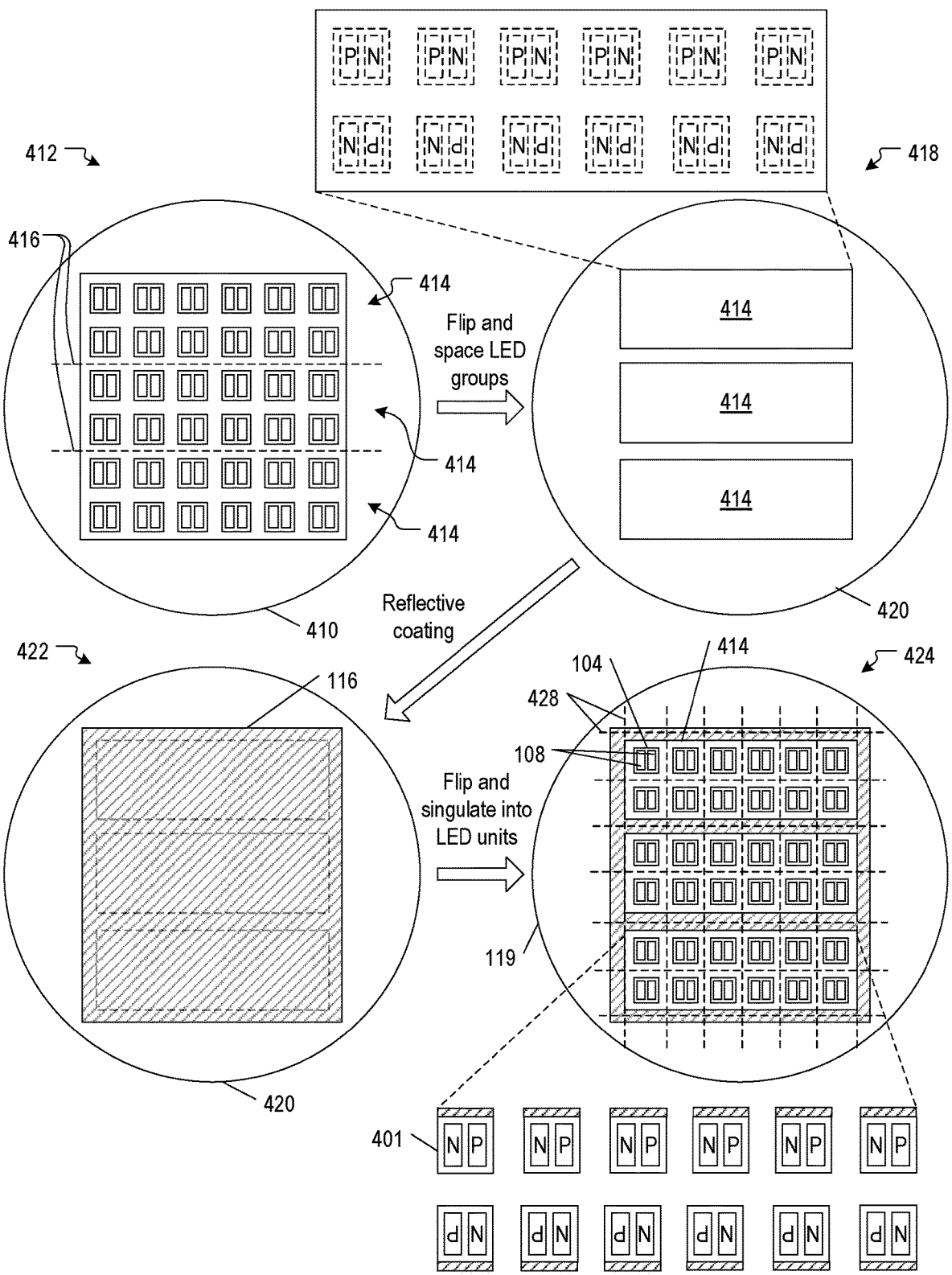

FIGS. 4 and 5 illustrate a top view of a level-1 packaging process 400 for making LED units or packages 401 (only one is labeled in view 424 of FIG. 5) in examples of the present disclosure. LED units 401 may be three-sided emitters. Referring to FIG. 4, view 402, LEDs 104 (only one is labeled) are placed with their bottom contact surfaces facing down on support 106. LEDs 104 are placed in a pattern, such as in double rows 404 (only one is labeled) of the LEDs. Each double row 404 includes a first row of LEDs with their contact pads 108 in a first orientation, and a second row of LEDs with the contact pads 108 in a second orientation that is rotated 180 degrees from the first orientation.

As shown in view 406, secondary light-emitting layer 112 is formed over LEDs 104 on support 106, and optically transparent spacer layer 114 is formed over the secondary light-emitting layer. As secondary light-emitting layer 112 is relatively thin, it conforms to the topography of LEDs 104 on support 106. In some examples where only the primary light is desired, secondary light-emitting layer 112 is omitted and transparent spacer layer 114 is formed over LEDs 104 on support 106. Transparent spacer layer 114 has a completely planar top surface or a substantially planar top surface with indentations, such as inverted cones or dimples, over LEDs 104. At this point LEDs 104 are held together by secondary light-emitting layer 112 and transparent spacer layer 114 or the transparent spacer layer alone.

As shown in view 408, LEDs 104 (only one is labeled) are flipped over by transferring them to a new support 410 so contacts 108 (only two are labeled) on the bottom contact surfaces of the LEDs are visible. Support 410 may be a tacky tape supported by a metal rim. As shown in view 412, LEDs 104 are cut into LED groups 414 having the same arrangement along horizontal scribe lanes 416. Each LED groups 414 includes a double row 404 of LEDs 104.

Referring to FIG. 5, view 418, LED groups 414 are spaced apart and then flipped over by transferring them to a new support 420. Support 420 may be a tacky tape on a metal frame.

As shown in view 422, optically reflective layer 116 is formed over and in-between LED groups 414 (not labeled). Reflective layer 116 prevents light from exiting through the top of LED units 401. Reflective layer 116 may be molded with a planar top surface. When transparent spacer layer 114 of LED groups 412 has inverted cones or dimples on its top surface, reflective layer 116 would fill in those indentations. At this point LED groups 414 are held together by reflective layer 116.

As shown in view 424, LED groups 414 are flipped over by transferring them to a new support 119 so contacts 108 on the bottom contact surfaces of LEDs 104 are visible. LEDs 104 (only one is labeled) are singulated into individual LED units 401 (only one is labeled) along orthogonal scribe lanes 428 (only two are labeled). Vertical scribe lanes 428 at the ends cut along or slightly into the left and right edges of LED groups 414 (only one is labeled) so no reflective layer 116 remain on those edges. Vertical scribe lanes 428 between the ends cut between neighboring LEDs 104. Horizontal scribe lanes 428 cut through reflective layer 116 above and below LED groups 414 so portions of the reflective layer 116 remains on the top edge of the first row and the bottom edge of the second row in each LED group.

Figure 6:
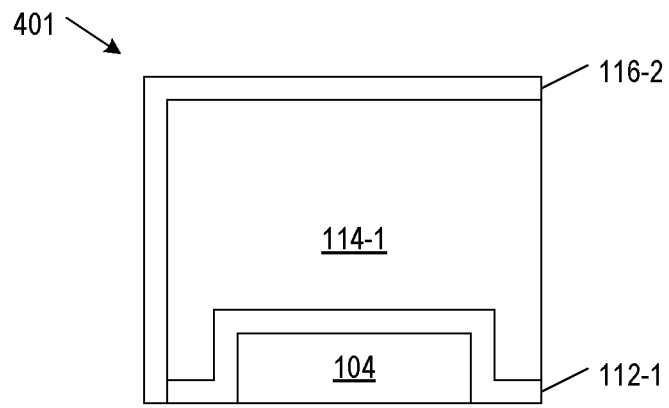
FIGS. 6 and 7 respectively illustrate a side cross-sectional view and a top view of a three-sided emitter package of FIG. 5 in examples of the present disclosure.
Figure 7:
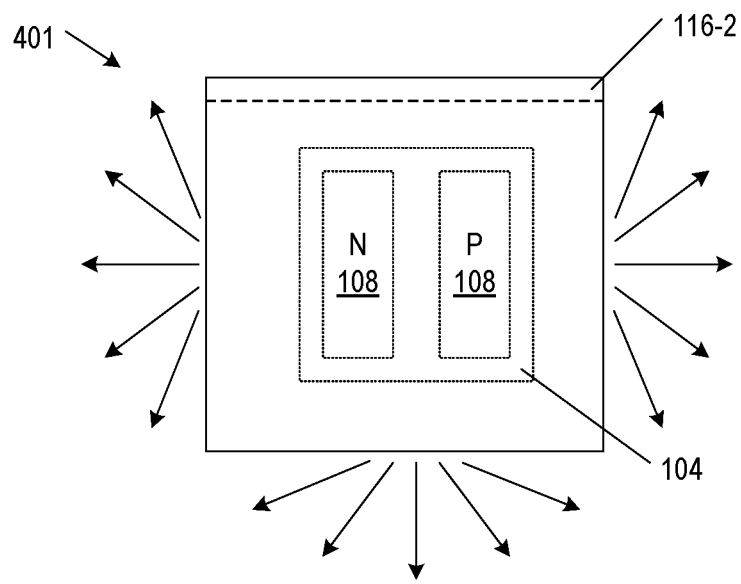

FIGS. 6 and 7 respectively illustrate a side cross-sectional view and a top view of LED unit 401 in examples of the present disclosure. LED unit 401 includes LED 104, secondary light emitter 112-1, transparent spacer 114-1, and a reflector 116-2. Reflector 116-2 forms two plates that sit over the top of transparent spacer 114-1 and one side of the transparent spacer and the brim of secondary light emitter 112-1. As shown in FIG. 7, LED unit 401 emits light only from three side-emitting surfaces that are not covered by reflector 116-2.

Figure 8:
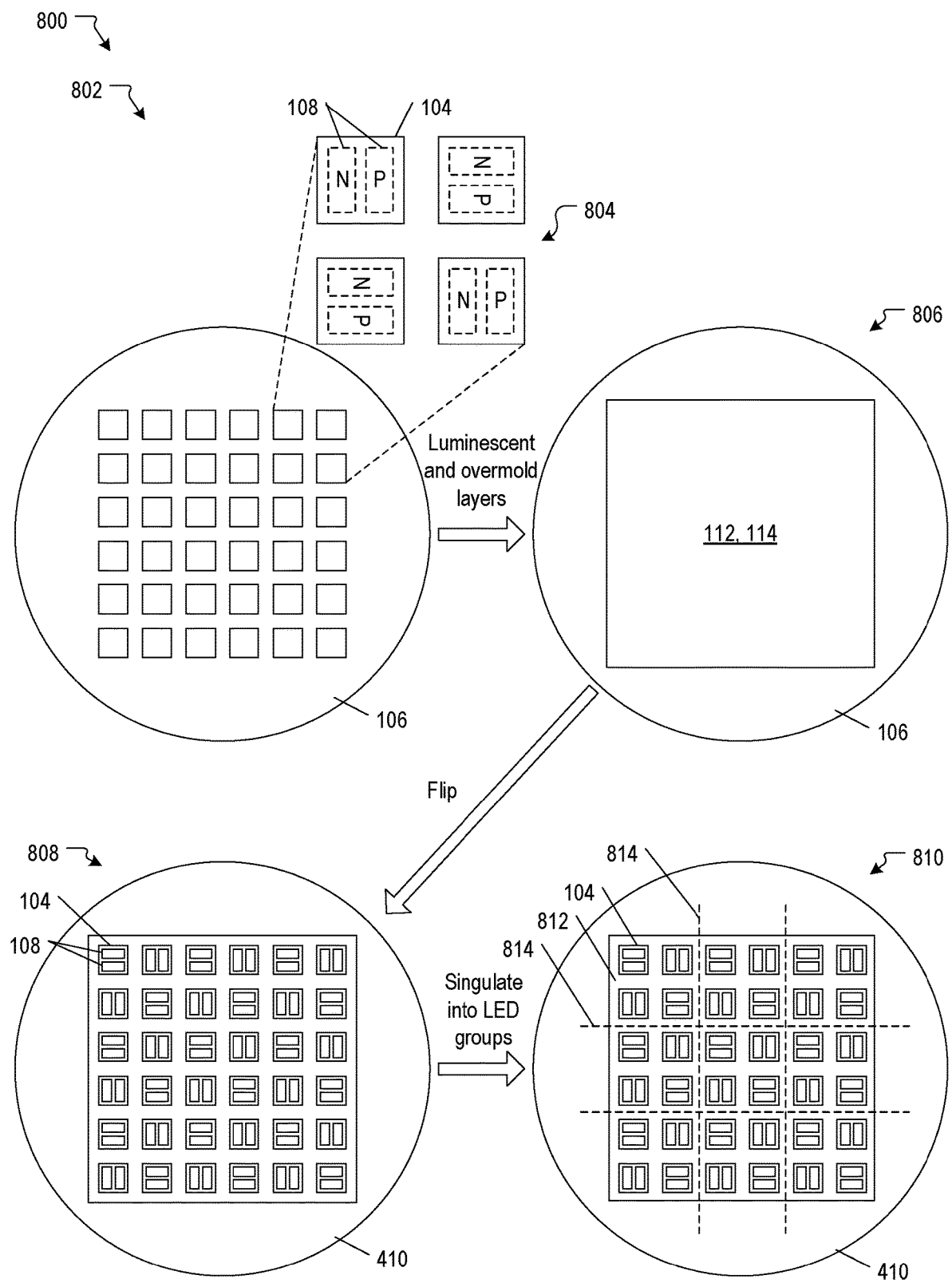
FIGS. 8 and 9 illustrate a top view of a packaging process for making two-sided emitter packages in examples of the present disclosure.
Figure 9:
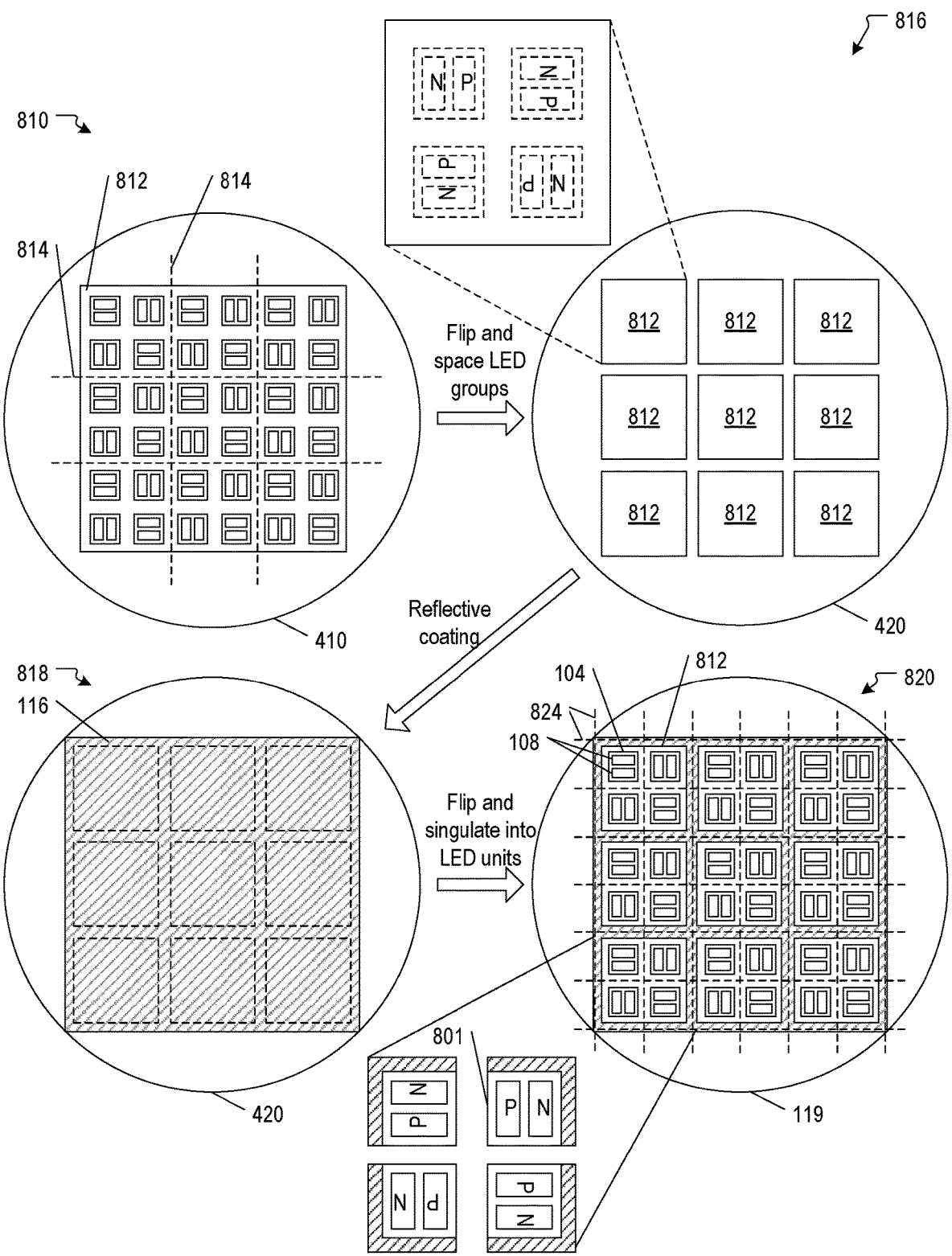

FIGS. 8 and 9 illustrate a top view of a level-1 packaging process 800 for making LED units or packages 801 (only one is labeled in view 820 of FIG. 9) in examples of the present disclosure. LED units 801 may be two-sided emitters. Referring to FIG. 8, view 802, LEDs 104 (only one is labeled) are placed with their bottom contact surfaces facing down on support 106. LEDs 104 are placed in a pattern, such as in two-by-two arrays 804 (only one is labeled). Each two-by-two array 804 includes, in a spiral order, a first LED with its contact pads 108 in a first orientation, a second LED with its contact pads 108 in a second orientation that is rotated 90 degrees from the first orientation, a third LED with its contact pads 108 in a third orientation that is rotated 90 degrees from the second orientation, and a fourth LED with its contact pads 108 in a fourth orientation that is rotated 90 degrees from the third orientation.

As shown in view 806, secondary light-emitting layer 112 is formed over LEDs 104 on support 106, and optically transparent spacer layer 114 is formed over the light-emitting layer. As secondary light-emitting layer 112 is relatively thin, it conforms to the topography of LEDs 104 on support 106. In some examples where only the primary light is desired, secondary light-emitting layer 112 is omitted and transparent spacer layer 114 is formed over LEDs 104 on support 106. Transparent spacer layer 114 has a completely planar top surface or a substantially planar top surface with indentations, such as inverted cones or dimples, over LEDs 104. At this point LEDs 104 are held together by secondary light-emitting layer 112 and transparent spacer layer 114 or the transparent spacer layer alone.

As shown in view 808, LEDs 104 (only one is labeled) are flipped over by transferring them to a new support 410 so contacts 108 (only two are labeled) on the bottom contact surfaces of LEDs 104 are visible. As shown in view 810, LEDs 104 (only one is labeled) are cut into LED groups 812 (only one is labeled) having the same arrangement along orthogonal scribe lanes 814 (only two are labeled). Each LED groups 810 includes a two-by-two array 804 of LEDs 104.

Referring to FIG. 9, view 816, LED groups 812 are spaced apart and then flipped over by transferring them to a new support 420.

As shown in view 818, optically reflective layer 116 is formed over and in-between LED groups 812 (not labeled). Reflective layer 116 prevents light from exiting through the top of LED units 801. Reflective layer 116 may be molded with a planar top surface. When transparent spacer layer 114 of LED groups 812 has inverted cones or dimples on its top surface, reflective layer 116 would be fill in those indentations. At this point LED groups 812 are held together by reflective layer 116.

As shown in view 820, LED groups 812 are flipped over by transferring them to a new support 119 so contacts 108 (only two are labeled) on the bottom contact surfaces of LEDs 104 (only one is labeled) are visible. LEDs 104 are singulated into individual LED units 801 (only one is labeled) along orthogonal scribe lanes 824 (only two are labeled). A first set of vertical and horizontal scribe lanes 824 cut through reflective layer 116 along the edges of each LED group 812 (only one is labeled) so portions of the reflective layer 116 remain on two adjacent lateral surfaces of each LED 104. A second set of vertical and horizontal scribe lanes 824 cut between neighboring LEDs 104 in each LED group 812 so two adjacent lateral surfaces of each LED 104 are without reflective layer 116.

Figure 10:
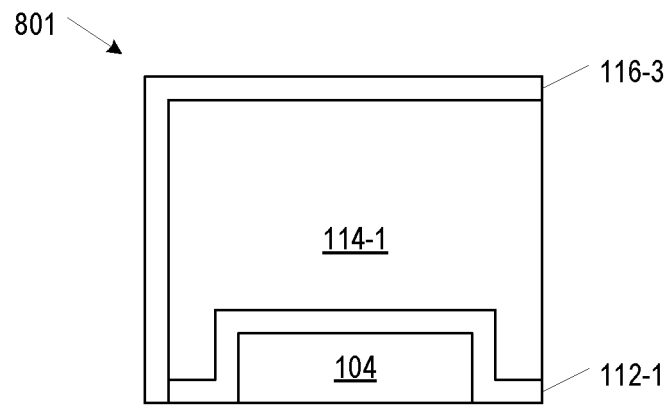
FIGS. 10 and 11 respectively illustrate a side cross-sectional view and a top view of a two-sided emitter package of FIG. 9 in examples of the present disclosure.
Figure 11:
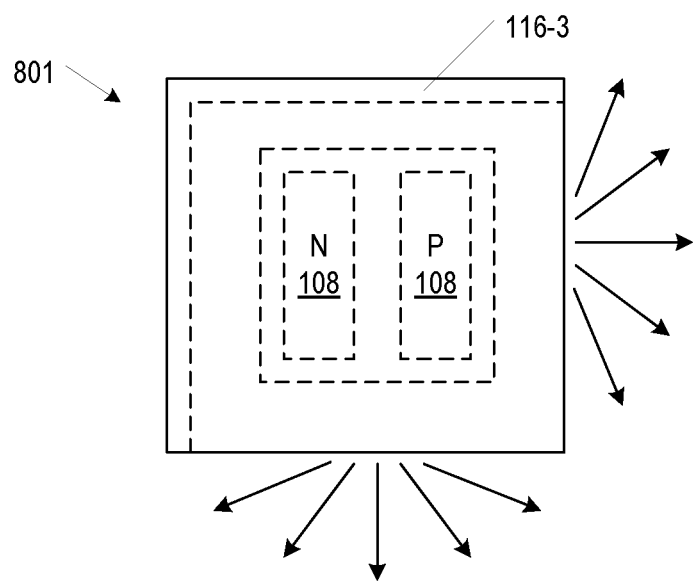

FIGS. 10 and 11 respectively illustrate a side cross-sectional view and a top view of LED unit 801 in examples of the present disclosure. LED unit 801 includes LED 104, secondary light emitter 112-1, transparent spacer 114-1, and a reflector 116-3. Reflector 116-3 forms three plates that sit over the top of transparent spacer 114-1 and two adjacent sides of the transparent spacer and the brim of secondary light emitter 112-1. As shown in FIG. 11, LED unit 801 emits light only from two adjacent side-emitting surfaces that are not covered by reflector 116-3.

Figure 12:
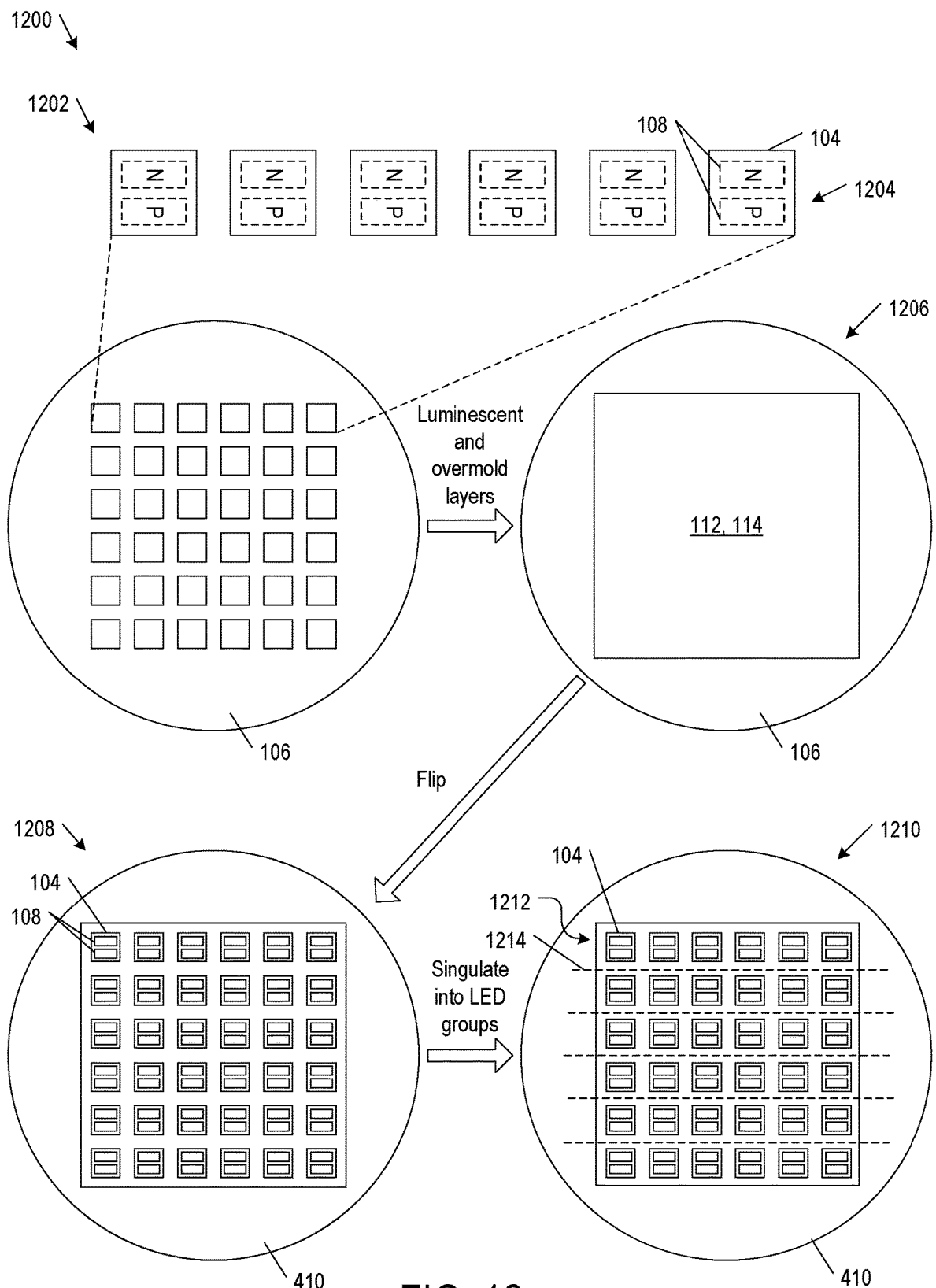
FIGS. 12 and 13 illustrate a top view of a packaging process for making two-sided emitter packages in examples of the present disclosure.
Figure 13:
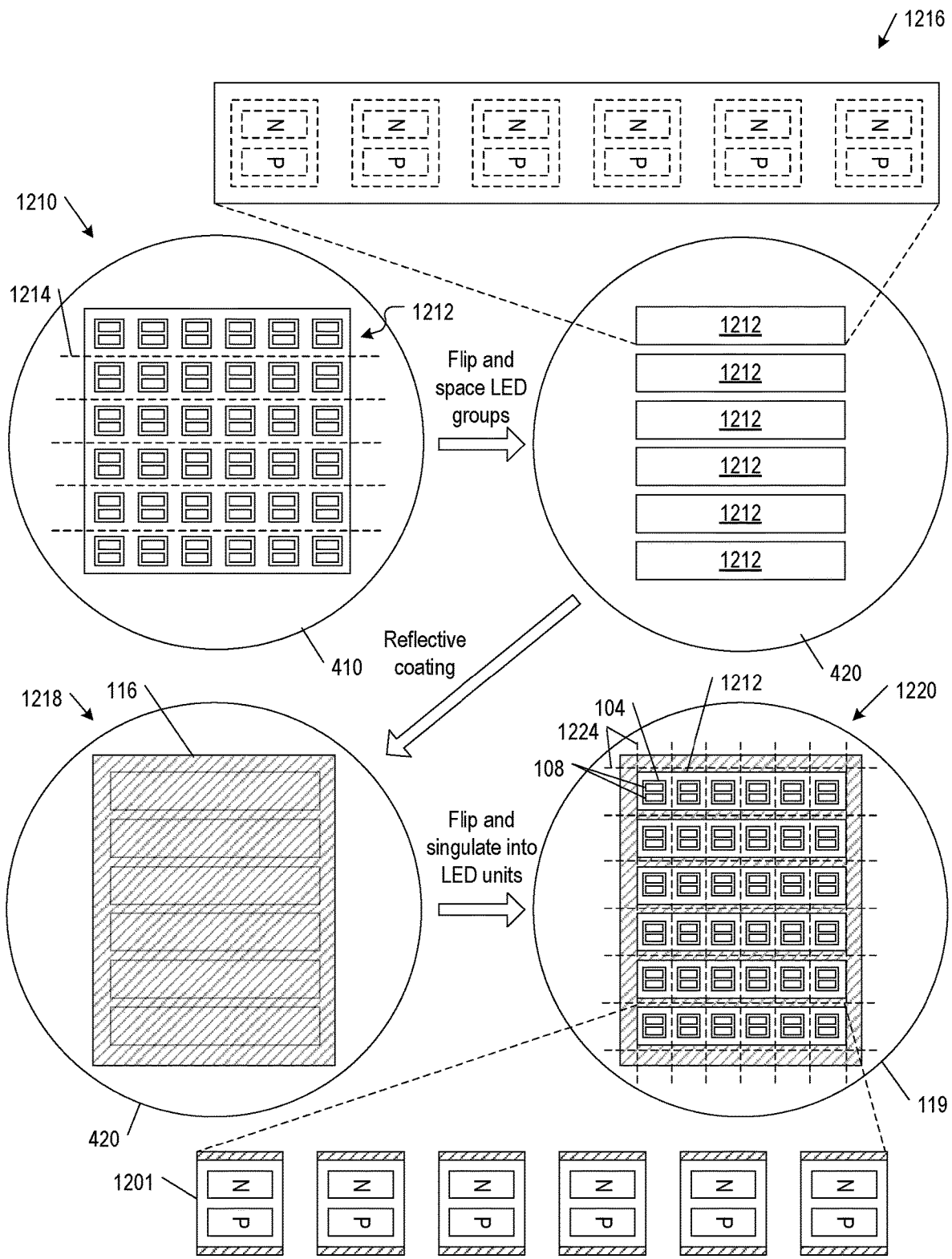

FIGS. 12 and 13 illustrate a top view of a level-1 packaging process 1200 for making LED units or packages 1201 (only one is labeled) in examples of the present disclosure. LED units 1201 may be two-sided emitters. Referring to FIG. 12, view 1202, LEDs 104 (only one is labeled in view 1220 of FIG. 13) are placed with their bottom contact surfaces facing down on support 106. LEDs 104 are placed in a pattern, such as in single rows 1204 (only one is labeled) of LEDs 104 having their contact pads 108 (only two are labeled) in the same orientation.

As shown in view 1206, secondary light-emitting layer 112 is formed over LEDs 104 on support 106, and optically transparent spacer layer 114 is formed over the secondary light-emitting layer. As secondary light-emitting layer 112 is relatively thin, it conforms to the topography of LEDs 104 on support 106. In some examples where only the primary light is desired, secondary light-emitting layer 112 is omitted and transparent spacer layer 114 is formed over LEDs 104 on support 106. Transparent spacer layer 114 has a completely planar top surface or a substantial planar top surface with indentations, such as inverted cones or dimples, over LEDs 104. At this point LEDs 104 are held together by secondary light-emitting layer 112 and transparent spacer layer 114 or the transparent spacer layer alone.

As shown in view 1208, LEDs 104 (only one is labeled) are flipped over by transferring them to a new support 410 so contacts 108 (only two are labeled) on the bottom contact surfaces of LEDs 104 are visible. As shown in view 1210, LEDs 104 (only one is labeled) are cut along horizontal scribe lanes 1214 (only one is labeled) to form LED groups 1212 (only one is labeled) having the same arrangement. Each LED groups 1212 includes a row 1204 of LEDs 104.

Referring to FIG. 13, view 1216, LED groups 1212 are spaced apart and then flipped over by transferring them to a new support 420.

As shown in view 1218, optically reflective layer 116 is formed over and in-between LED groups 1212 (not labeled). Reflective layer 116 prevents light from exiting through the top of LED units 1201. Reflective layer 116 may be molded with a planar top surface. When transparent spacer layer 114 of LED groups 1212 has inverted cones or dimples on its top surface, reflective layer 116 would fill in those indentations. At this point LED groups 1212 are held together by reflective layer 116.

As shown in view 1220, LED groups 1212 are flipped over by transferring them to a new support 119 so contacts 108 (only two are labeled) on the bottom contact surfaces of LEDs 104 are visible. LEDs 104 (only one is labeled) are singulated into individual LED units 1201 (only one is labeled) along orthogonal scribe lanes 1224 (only two are labeled). Horizontal scribe lanes 1224 cut through reflective layer 116 along top and bottom edges of LED groups 1212 (only one is labeled) so portions of the reflective layer 116 remain on two opposing lateral surfaces of each LED unit 1201. Vertical scribe lanes 1224 cut along or slightly into left and right edges of LED groups 1212 and between neighboring LEDs 104 in each LED group so the other two opposing lateral surfaces of each LED unit 1201 are without reflective layer 116.

Figure 14:
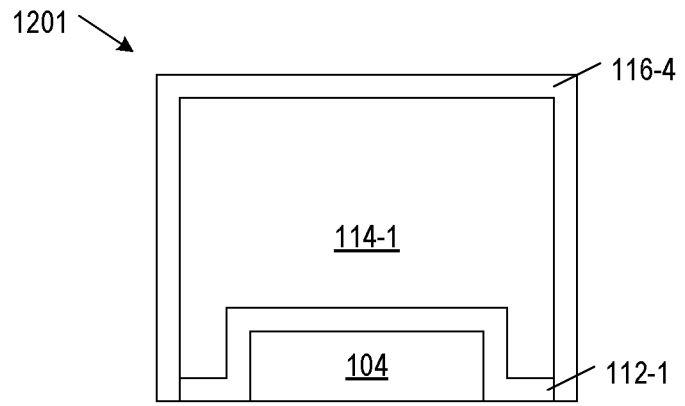
FIGS. 14 and 15 respectively illustrate a side cross-sectional view and a top view of a two-sided emitter package of FIG. 13 in examples of the present disclosure.
Figure 15:
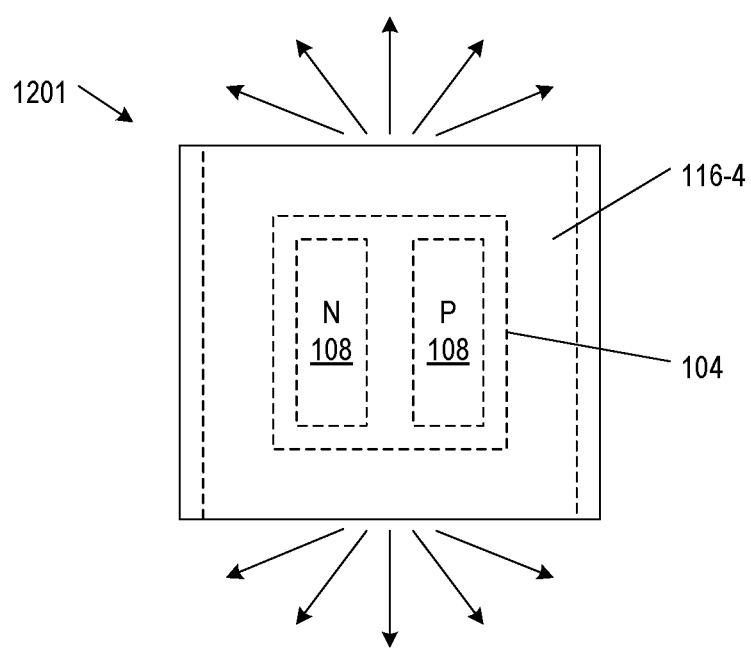

FIGS. 14 and 15 respectively illustrate a side cross-sectional view and a top view of an LED unit 1201 in examples of the present disclosure. LED unit 1201 includes LED 104, secondary light emitter 112-1, transparent spacer 114-1, and a reflector 116-4. Reflector 116-4 forms three plates that sit over the top of transparent spacer 114-1 and two opposing sides of the transparent spacer and the brim of secondary light emitter 112-1. As shown in FIG. 15, LED unit 1201 emits light only from two opposing side-emitting surfaces that are not covered by reflector 116-4.

Figure 16:
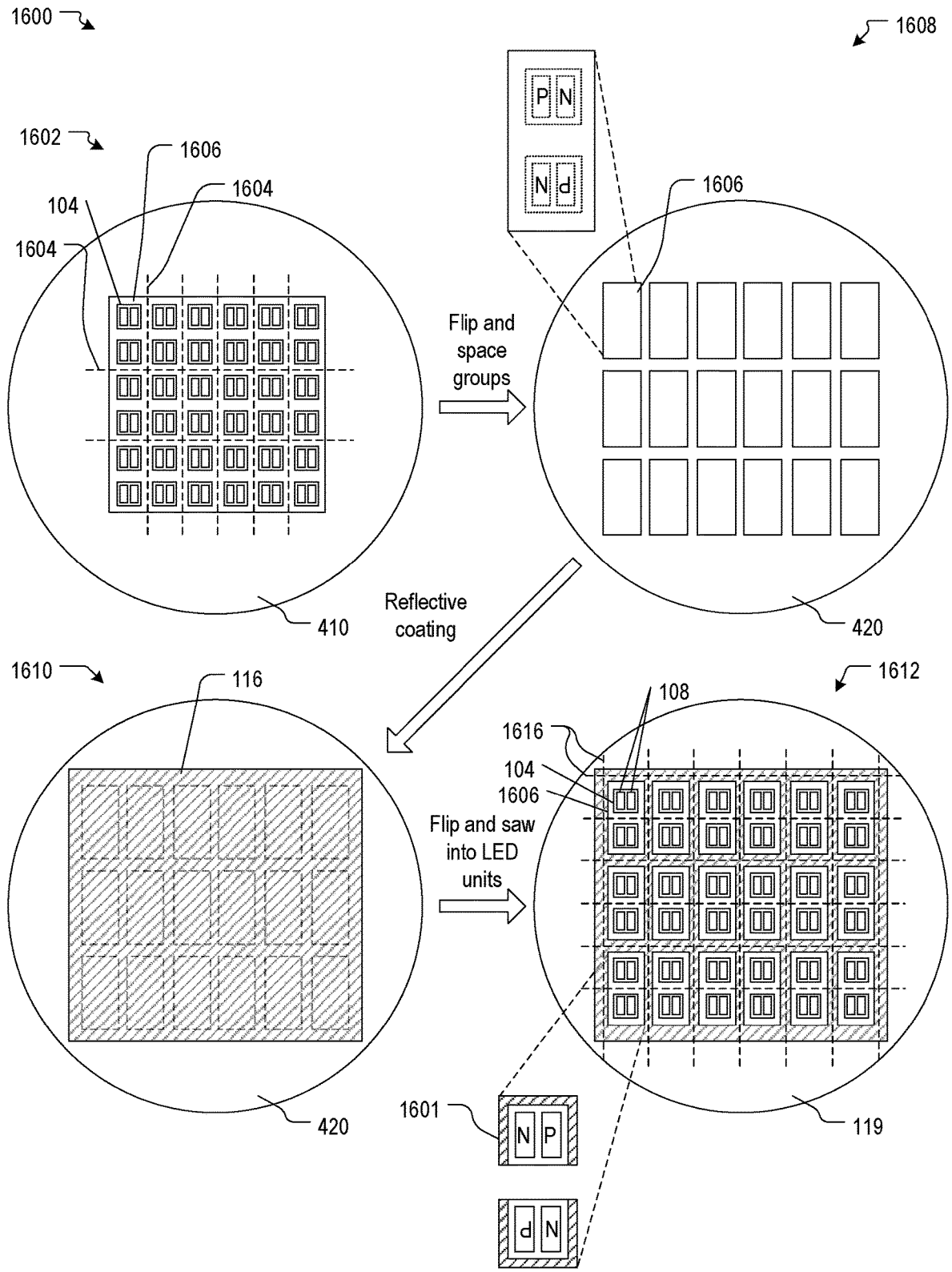
FIG. 16 illustrates a top view of a packaging process for making single-sided emitter packages in examples of the present disclosure.

FIG. 16 illustrates a top view of a level-1 packaging process 1600 for making LED units or package 1601 (only one is labeled) in examples of the present disclosure. LED units 1601 may be single-sided emitters. Process 1600 starts with the same steps as process 400 up to view 408 (FIG. 4). View 408 may then be followed by view 1602 where LEDs 104 (only one is labeled) are cut along orthogonal scribe lanes 1604 (only two are labeled) to form LED groups 1606 (only one is labeled) having the same arrangement. Each LED groups 1606 includes two vertically adjacent LEDs 104 in the same double row 404 (FIG. 4) and the two vertically adjacent LEDs have their contact pads in orientations that are 180 degrees apart.

As shown in view 1608, LED groups 1606 (only one is labeled) are spaced apart and flipped over by transferring them to a new support 420.

As shown in view 1610, optically reflective layer 116 is formed over and in-between LED groups 1606 (not labeled). Reflective layer 116 prevents light from exiting through the top of LED units 1601. Reflective layer 116 may be molded with a planar top surface. When transparent spacer layer 114 of LED groups 1606 has inverted cones or dimples on its top surface, reflective layer 116 would fill in those indentations. At this point LED groups 1606 are held together by reflective layer 116.

As shown in view 1612, LED groups 1606 (only one is labeled) are flipped over by transferring them to a new support 119 so contacts 108 (only two are labeled) on the bottom contact surfaces of LEDs 104 are visible. LEDs 104 (only one is labeled) are singulated into individual LED units 1601 (only one is labeled) along orthogonal scribe lanes 1616 (only two are labeled). Vertical scribe lanes 1616 and a first set of horizontal scribe lanes 1616 cut through reflective layer 116 along the perimeter of each LED group 1606 so portions of the reflective layer 116 remain on three adjacent lateral surfaces of each LED unit 1601. A second set of horizontal scribe lanes 1616 cut between LEDs 104 in each LED group 1606 so one lateral surface of each LED unit 1601 is without reflective layer 116.

Figure 17:
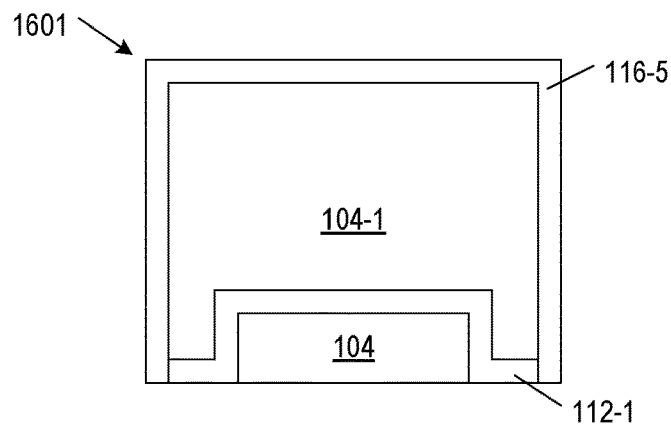
FIGS. 17 and 18 respectively illustrate a side cross-sectional view and a top view of a single-sided emitter package of FIG. 16 in examples of the present disclosure.
Figure 18:
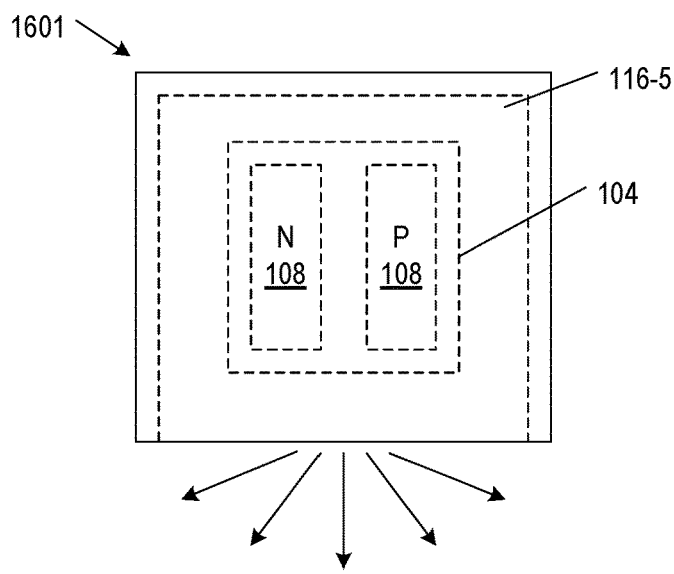

FIGS. 17 and 18 respectively illustrate a side cross-sectional view and a top view of an LED unit 1601 in examples of the present disclosure. LED unit 1601 includes LED 104, secondary light emitter 112-1, transparent spacer 114-1, and a reflector 116-5. Reflector 116-5 forms four plates that sit over the top of the transparent spacer 114-1 and three adjacent sides of the transparent spacer and the brim of secondary light emitter 112-1. As shown in FIG. 18, LED unit 1601 emits light only from one side-emitting surface that is not covered by reflector 116-5.

Figure 19:
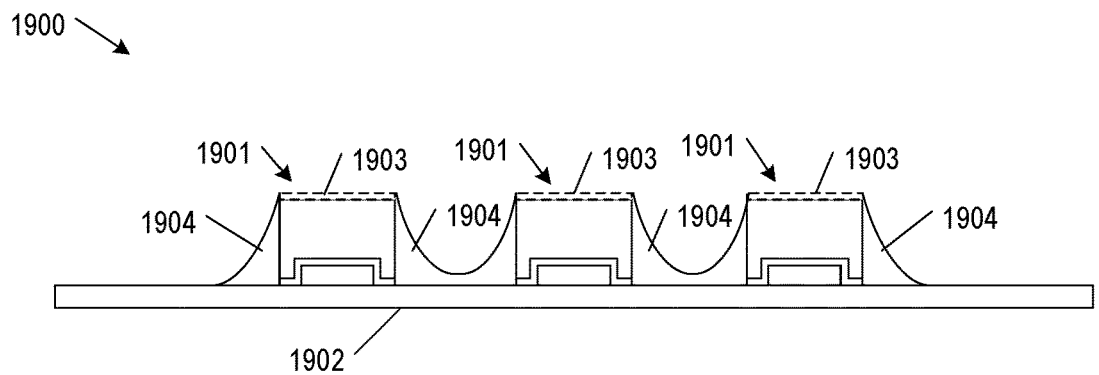
FIG. 19 illustrates a side cross-sectional view of a structure formed by an assembly process for integrating four or five-sided emitters on a printed circuit board in examples of the present disclosure.

FIG. 19 illustrates a side cross-sectional view of a structure or light engine 1900 formed by a level-2 assembly process for integrating LED units 1901 on a PCB 1902 in examples of the present disclosure. LED units 1901 may be five-sided emitters that emit light from its top and side-emitting surfaces. Alternatively LED units 1901 may be four-sided emitters that have reflectors 1903 on their top so they emit light from their sides. For example LED units 1901 may be LED units 101 (FIGS. 1 to 3). PCB 1902 includes traces that connect LED units 1901 in series or parallel. A number of methods may be used to fix LED units 1901 to PCB 1902. For example solder paste is applied to bonding areas on PCB 1902 and LED units 1901 are picked and placed on the bonding areas, and the PCB with the LED units are sent through a reflow oven to fix the LED units to the PCB.

To enhance lateral radiation patter into specific azimuthal directions, a reflective material is dispensed between LED units 1901 or on selected sides of the LED units. The reflective material may be TiOx (or another translucent or diffusive metal oxide) in silicone. As a result of capillary action, the reflective material forms reflective fillets 1904 that cover the selected sides of LED units 1901 to create the desired radiation pattern. For example, reflective fillets 1904 may cover adjacent sides, opposing sides, three sides of each LED unit 1901.

Figure 20:
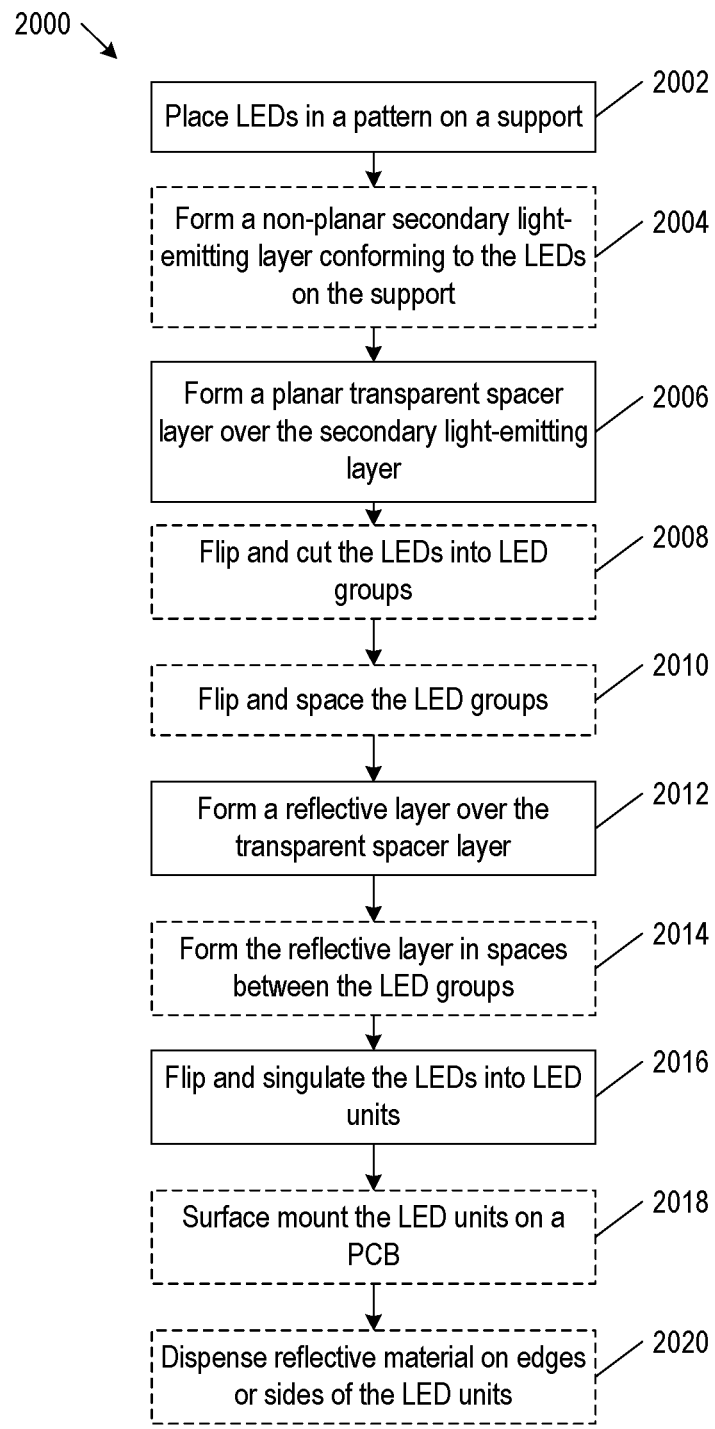
FIG. 20 is a flowchart of a method to make N-sided emitters in examples of the present disclosure.

FIG. 20 is a flowchart of a method 2000 to make N-sided emitters described above in examples of the present disclosure. Method 2000 may begin with block 2002.

In block 2002, LEDs 104 are arranged in a pattern. As described above, the pattern may be a square or rectangular matrix 109 (FIG. 1), double rows 404 (FIG. 4), two-by-two arrays 804 (FIG. 8), or single rows 1204 (FIG. 12). Block 2002 may be followed by optional block 2004.

In optional block 2004, secondary light-emitting layer 112 is formed over and conforms to LEDs 104. Optional block 2004 may be skipped when only the primary light is desired. Optional block 2004 may be followed by block 2006.

In block 2006, optically transparent spacer layer 114 is formed over secondary light-emitting layer 112 or LEDs 104 when the secondary light-emitting layer is omitted. Block 2006 may be followed by optional block 2008.

In optional block 2008, LEDs 104 are flipped and cut into LED groups. As described above, the LED groups may be LED groups 414 (FIG. 4), 812 (FIG. 8), 1212 (FIG. 12), or 1606 (FIG. 16). Optional block 2008 may be skipped when making four-sided emitters 101. Optional block 2008 may be followed by optional block 2010.

In optional block 2010, the LED groups are spaced apart and flipped over or vice versa. Optional block 2010 may be skipped when making four-sided emitters 101. Optional block 2010 may be followed by block 2012.

In block 2012, optically reflective layer 116 is formed over LEDs 104 when making four-sided emitters or over the LED groups when making three, two, or single-sided emitters. Block 2012 may be followed by optional block 2014.

In optional block 2014, reflective layer 116 is formed in spaces between the LED groups when making three, two, or single-sided emitters. Block 2012 and optional block 2014 may be the same step as reflective layer 116 is molded over and in-between the LED groups. Optional block 2014 may be followed by block 2016.

In block 2016, LEDs 104 or the LED groups are flipped and singulated into LED units. The LED units may be LED units 101 (FIG. 1), 401 (FIG. 4), 801 (FIG. 8), 1201 (FIG. 12), or 1601 (FIG. 16). The LED units may be tested, binned, and stored in a reeled tape. Blocks 2002 to 2016 may be part of a level-1 packaging process. Block 2016 may be followed by optional block 2018.

In block 2018, the LED units are surface mounted on a PCB to form a structure such as a light engine. Optional block 2018 may be followed by optional block 2020.

In block 2020, a reflective material is dispensed between or on the sides of the LED units on the PCB. The reflective material forms fillets that cover selected sides of the LED units so the resulting structure generates a desired radiation pattern. For example, reflective material is dispensed between and on the sides of LED units 1901 (FIG. 19) on PCB 1902 (FIG. 19) to create fillets 1902 (FIG. 19) on selected sides of the LED units.

Various other adaptations and combinations of features of the embodiments disclosed are within the scope of the invention. Numerous embodiments are encompassed by the following claims.

The invention claimed is:
1. A method of forming side emitting light-emitting diode (LED) units, the method comprising:

arranging a plurality of LEDs in a pattern on a temporary support;
forming a secondary light-emitting layer that conforms to the plurality of LEDs, covering top and side-emitting surfaces of each of the plurality of LEDs;
after forming the secondary light-emitting layer, forming an optically transparent spacer layer over the plurality of LEDs;
forming an optically reflective layer over the optically transparent spacer layer to form a structure that includes at least the plurality of LEDs, the secondary light-emitting layer, the optically transparent spacer layer and the optically reflective layer; and
after the optically reflective layer is formed over the optically transparent spacer layer, singulating the structure into a plurality of LED units, each of the plurality of LED units including at least one of the plurality of LEDs, a portion of the secondary light-emitting layer, a portion of the transparent spacer layer formed over the at least one of the plurality of LEDs, and a portion of the reflective layer formed over the portion of the transparent spacer layer.

2. The method of claim 1, further comprising, after forming the optically reflective layer and before singulating the structure into the plurality of LED units, flipping the structure.

3. The method of claim 1, wherein the singulating the structure into the plurality of LED units further comprises singulating the structure to form a plurality of four-sided emitters, each of the plurality of four-sided emitters comprising:
one of the plurality of LEDs,
the portion of the optically transparent spacer formed over the one of the plurality of LEDs, and
the portion of the optically reflective layer formed over the portion of the optically transparent spacer.

4. The method of claim 1, wherein the singulating the structure into the plurality of LED units further comprises singulating the structure to form a plurality of four-sided emitters, each of the plurality of four-sided emitters comprising:
one of the plurality of LEDs,
the portion of the secondary light emitting layer formed over the top and side-emitting surfaces of the one of the plurality of LEDs,
the portion of the optically transparent spacer layer formed over the portion of the secondary light emitting layer, and
the portion of the optically reflective layer formed over the portion of the optically transparent spacer.

5. The method of claim 1, wherein the secondary light-emitting layer comprises a laminate including a first layer of phosphor in silicone and a second layer of titanium oxide in silicone.

6. The method of claim 1, wherein forming the optically transparent spacer layer comprises molding dimples in the optically transparent spacer layer over the plurality of LEDs.

7. The method of claim 1, wherein the optically transparent spacer layer comprises silicone and the optically reflective layer comprises titanium oxide in silicone.

8. A method of forming side emitting light-emitting diode (LED) units, the method comprising:
arranging a plurality of LEDs in a pattern on a temporary support;
forming an optically transparent spacer layer over the plurality of LEDs to form a first structure that includes at least the plurality of LEDs and the optically transparent spacer layer;
cutting the first structure to form a plurality of LED groups;
arranging the plurality of LED groups on a second temporary support such that spaces are formed between adjacent LED groups on the second temporary support;
forming a single optically reflective layer over the optically transparent spacer layer of each of the plurality of LED groups on the second temporary support such that the single optically reflective layer is also formed in the spaces between the adjacent LED groups to form a second structure; and
after forming the single optically reflective layer over the optically transparent spacer layer, singulating the second structure to form a plurality of one-side emitting, two-side emitting or three-side emitting LED units.

9. The method of claim 8, further comprising, after forming the optically transparent spacer layer and before cutting the first, structure, flipping the first structure.

10. The method of claim 8, further comprising, after cutting the first structure and before arranging the plurality of LED groups, flipping each of the plurality of LED groups.

11. The method of claim 10, further comprising, after forming the single optically reflective layer and before singulating the second structure, flipping the second structure.

12. The method of claim 8, further comprising, after arranging the plurality of LEDs on the temporary support and before forming the optically transparent spacer layer, forming a secondary light-emitting layer that conforms to the plurality of LEDs, covering top and side-emitting surfaces of each of the plurality of LEDs.

13. The method of claim 12, wherein:
the arranging the plurality of LEDs in the pattern comprises placing double rows of LEDs on the temporary support, each double row comprising a first row of LEDs having contact pads in a first orientation and a second row of LEDs having contact pads in a second orientation that is rotated 180 degrees from the first orientation,
the LED groups each comprise a double row of LEDs, and
the singulating the second structure further comprises singulating the second structure such that a portion of the optically reflective layer covers a top surface of each of the plurality of LED units and a single lateral surface of each of the plurality of LED units to form a plurality of three-side emitting LED units.

14. The method of claim 12, wherein:
the arranging the plurality of LEDs in the pattern comprises placing two-by-two arrays of LEDs on the temporary support, each of the two-by-two arrays comprising, in a spiral order, a first LED having contact pads in a first orientation, a second LED having contact pads in a second orientation that is rotated 90 degrees from the first orientation, a third LED having contact pads in a third orientation that is rotated 90 degrees from the second orientation, and a fourth LED having contact pads in a fourth orientation that is rotated 90 degrees from the third orientation,
the LED groups each comprise one of the plurality of two-by-two arrays, and
the singulating further comprises singulating the second structure such that a portion of the optically reflective layer covers a top surface of each of the plurality of LED units and two lateral surfaces of each of the plurality of LED units to form a plurality of two-side emitting LED units.

15. The method of claim 12, wherein:
the arranging the plurality of LEDs in the pattern comprises placing rows of LEDs of a same orientation on the temporary support,
the LED groups each comprise a single row of LEDs, and
the singulating further comprises singulating the second structure such that a portion of the optically reflective layer covers a top surface of each of the plurality of LED units and two lateral surfaces of each of the plurality of LED units to form a plurality of two-side emitting LED units.

16. The method of claim 12, wherein:
the arranging the plurality of LEDs in the pattern comprises placing double rows of LEDs on the temporary support, each double row comprising a first row of LEDs having contact pads in a first orientation and a second row of LEDs having contact pads in a second orientation that is rotated 180 degrees from the first orientation,
the LED groups each comprise two vertically adjacent LEDs in a double row of LEDs, and
the singulating further comprises singulating the second structure such that a portion of the optically reflective layer covers a top surface of each of the plurality of LED units and two lateral surfaces of each of the plurality of LED units to form a plurality of two-side emitting LED units.

17. A method of forming side emitting light-emitting diode (LED) units, the method comprising:
arranging a plurality of LEDs in a pattern on a temporary support;
forming an optically transparent spacer layer over all of the plurality of LEDs on the transparent substrate;
forming an optically reflective layer over the optically transparent spacer layer, covering an entire surface of the optically transparent spacer layer or an intervening layer, to form a structure that includes at least the plurality of LEDs, the optically transparent spacer layer and the optically reflective layer;
after forming the optically reflective layer and before singulating the structure into the plurality of LED units, flipping the structure; and
after the optically reflective layer is formed over the optically transparent spacer layer, singulating the structure into a plurality of LED units, each including at least one of the plurality of LEDs, a portion of the transparent spacer surrounding top and side surfaces of the at least one of the plurality of LEDs, and a portion of the reflective layer formed over the portion of the transparent spacer layer.

18. The method of claim 17, wherein the singulating the structure into the plurality of LED units further comprises singulating the structure to form a plurality of four-sided emitters, each of the plurality of four-sided emitters comprising:
one of the plurality of LEDs,
the portion of the optically transparent spacer formed over the one of the plurality of LEDs, and
the portion of the optically reflective layer formed over the portion of the optically transparent spacer.

19. The method of 17, wherein: the singulating the structure into the plurality of LED units further comprises singulating the structure to form a plurality of four-sided emitters, each of the plurality of four-sided emitters comprising:
one of the plurality of LEDs,
a portion of a secondary light emitting layer formed over the top and side-emitting surfaces of the one of the plurality of LEDs,
the portion of the optically transparent spacer layer formed over the portion of the secondary light emitting layer, and
the portion of the optically reflective layer formed over the portion of the optically transparent spacer.

* * * * *

UNITED STATES PATENT AND TRADEMARK OFFICE
CERTIFICATE OF CORRECTION

| | |
|---|---|
| PATENT NO. | : 10,693,048 B2 |
| APPLICATION NO. | : 15/765678 |
| DATED | : June 23, 2020 |
| INVENTOR(S) | : Diana et al. |

It is certified that error appears in the above-identified patent and that said Letters Patent is hereby corrected as shown below:

In the Specification

In Column 3, Line 16, delete "110." and insert --114.-- therefor

In Column 3, Line 21, delete "110." and insert --114.-- therefor

In Column 4, Line 28, delete "412" and insert --414-- therefor

In Column 5, Line 26, delete "groups 810" and insert --group 812-- therefor

In Column 8, Line 59, delete "1902" and insert --1904-- therefor

In the Claims

In Column 9, Line 5, in Claim 1, delete "LEDs:" and insert --LEDs;-- therefor

In Column 9, Line 20, in Claim 1, before "transparent", insert --optically--

In Column 9, Line 22, in Claim 1, before "reflective", insert --optically--

In Column 9, Line 23, in Claim 1, before "transparent", insert --optically--

In Column 9, Line 35, in Claim 3, after "spacer", insert --layer--

In Column 9, Line 38, in Claim 3, delete "spacer." and insert --spacer layer.-- therefor In Column 9, Line 45, in Claim 4, delete "light emitting" and insert --light-emitting-- therefor In Column 9, Line 49, in Claim 4, delete "light emitting" and insert --light-emitting-- therefor Signed and Sealed this
Third Day of September, 2024

Katherine Kelly Vidal
*Director of the United States Patent and Trademark Office*

CERTIFICATE OF CORRECTION (continued)
U.S. Pat. No. 10,693,048 B2

In Column 9, Line 52, in Claim 4, delete "spacer." and insert --spacer layer.-- therefor In Column 10, Line 22, in Claim 9, delete "first," and insert --first-- therefor In Column 10, Line 44, in Claim 13, before "LED", insert --plurality of--

In Column 10, Line 63, in Claim 14, before "LED", insert --plurality of--

In Column 11, Line 8, in Claim 15, before "LED", insert --plurality of--

In Column 11, Line 36, in Claim 17, delete "the" and insert --a-- therefor

In Column 12, Line 11, in Claim 17, before "transparent", insert --optically--

In Column 12, Line 11, in Claim 17, before "surrounding", insert --layer--

In Column 12, Line 13, in Claim 17, before "reflective", insert --optically--

In Column 12, Line 14, in Claim 17, before "transparent", insert --optically--

In Column 12, Line 21, in Claim 18, after "spacer", insert --layer--

In Column 12, Line 24, in Claim 18, delete "spacer." and insert --spacer layer.-- therefor In Column 12, Line 25, in Claim 19, before "17,", insert --claim--

In Column 12, Line 25, in Claim 19, delete "wherein:" and insert --wherein-- therefor In Column 12, Line 32, in Claim 19, delete "side-emitting" and insert --side-- therefor In Column 12, Line 38, in Claim 19, delete "spacer." and insert --spacer layer.-- therefor